United States Patent [19]
Hed

[11] Patent Number: 5,270,296
[45] Date of Patent: Dec. 14, 1993

[54] HIGH CRITICAL TEMPERATURE SUPERCONDUCTING WIRE WITH RADIALLY GROWN CRYSTALLITES

[75] Inventor: Aharon Z. Hed, Nashua, N.H.

[73] Assignee: Troy Investments Inc., Nashua, N.H.

[21] Appl. No.: 876,526

[22] Filed: Apr. 30, 1992

Related U.S. Application Data

[60] Division of Ser. No. 661,406, Feb. 26, 1991, abandoned, which is a continuation-in-part of Ser. No. 291,681, Dec. 29, 1988, Pat. No. 5,047,386.

[51] Int. Cl.⁵ .......................... B05D 3/06; B05D 5/12
[52] U.S. Cl. .......................................... 505/1; 505/704; 505/733; 505/740; 427/62; 427/596; 427/376.2; 427/419.2; 29/599; 174/125.1
[58] Field of Search ................ 505/1, 704, 740, 733; 427/62, 63, 596, 376.2, 419.1, 419.2; 29/599; 174/125.1

[56] References Cited

U.S. PATENT DOCUMENTS 5,070,071 12/1991 Geballe et al. ........................ 505/1

FOREIGN PATENT DOCUMENTS 2-279507 11/1990 Japan.

*Primary Examiner*—Roy King
*Attorney, Agent, or Firm*—Herbert Dubno

[57] ABSTRACT

A method of making a composite high-temperature superconducting wire in which a layer of a superconductive oxide is coated onto a refractory core by melting a zone of the layer uniformly all around the core as the core is drawn through the focus of a reflector having the shape of a paraboloid of revolution while directing onto the reflector a collimated beam of an energy sufficient to melt the layer. The melted layer is cooled with a substantially radially symmetrical thermal gradient to form the superconducting oxide ceramic layer on the core with radially-directed growth of columnar grains of the superconducting oxide ceramic.

4 Claims, 4 Drawing Sheets

HIGH CRITICAL TEMPERATURE SUPERCONDUCTING WIRE WITH RADIALLY GROWN CRYSTALLITES

CROSS REFERENCE TO RELATED APPLICATIONS

This application is a division of Ser. No. 07/661,406 filed Feb. 26, 1991, now abandoned, which was a continuation-in-part of Ser. No. 07/291,681 filed Dec. 29, 1988, now U.S. Pat. No. 5,047,386.

FIELD OF THE INVENTION

The invention relates to an apparatus for producing composite high-critical-temperature superconductive wires for carrying currents with essentially zero Joule heating losses.

BACKGROUND OF THE INVENTION

In the prior art and herein, zero Joule heating loss in wires is achieved by the use of substances known as superconductors in which the coherent motion of paired-charges proceeds in the absence of scattering by, and interaction with, the host lattice, grain boundaries, defects, imperfections and other charge carriers. A great need for such wires exists in practical applications such as long distance transmission of power, motors and generators, high field electromagnets, and superconducting magnet energy storage systems.

Until recently, it was believed that superconductivity above 23 K. was not possible. This belief stemmed from the theoretical work now named the BCS theory (Bardeen, Cooper and Schrieffer) which predicted such an upper limit. The temperature at which superconductivity begins in a superconductor (in the absence of any external magnetic fields) is termed the critical temperature (Tc) of that superconductor and this term will be used herein.

In the early 1970's a number of theoretical proposals were presented, suggesting that the critical temperature for superconductivity could be increased. (V. L. Ginzburg, Usp. Fiz. Nauk. 101, 185 (1970)) (D. Allender, J. Bray, J. Bardeen, Phys. Rev. B8, 4433 (1973)), but the lack of any discoveries of superconductivity above 23 K. solidified the belief that indeed this critical temperature could not be exceeded. A significant experimental breakthrough in high temperature superconductivity (critical temperatures in excess of 23 K.) was provided in November 1986 by Bednorz and Müller when they published a tentative disclosure of high temperature superconductivity (Georg Bednorz and Alex Müller, Z. Phys. B64, 189 (1986)). Following this disclosure, another report cited a critical temperature above 30 K. for $La(2-x)Ba(x)CuO(4-y)$, (H. Takagi, S. Uchida, K. Kitazawa, S. Tanaka, Jpn. J. Appl. 25 Phys. 26, L123 (1987)).

Confirmation of a critical temperature of 93 K. was reported by Chu for yttrium-barium-copper oxide ceramic (M. K. MU, J. R. Ashburn, C. J. Tang, P. H. Hor, R. L. Meng, L. Gao, Z. J. Huang, Y. Q. Wang, and C. W. Chu, Phys. Rev. Lett. 58, 2 March, 1987, p. 908). This material was dubbed the 123 compound and has served as a model for advanced research in the field.

Since that time, there have been a large number of papers published, and a large number of well attended meetings on this subject. One source of information about high-$T_c$ superconductivity is a 400 page volume of 112 papers that were published in Physical Review Letters, and Physical Review during the first 6 months of 1987. During 1987 and 1988, a number of families of high temperature superconducting materials have been discovered. These materials are usually ceramics containing copper (whose apparent valence state is trivalent), an alkaline metal (Ca, Sr, or Ba) and a rare earth including Yttrium. In some later developments, the rare earth has been partially or completely replaced with Bi or with thallium.

Most of these superconductors showed some degree of anisotropy in their properties and it was therefore significant when a cubic ceramic with a critical temperature above 23 K. (specifically 30 K.) was discovered based on a complex oxide of Ba, K and Bi. This superconductor was significant in that it was the first high temperature superconductor without copper in its composition, thus indicating that the occurrence of high temperature superconductivity may be more prevalent than originally realized. Amorphous high temperature superconductors have also been reported based on the bismuth compounds in which some of the bismuth was replaced with lead. The critical temperatures and critical current of these amorphous superconductors are somewhat lower than those of their crystalline counterparts.

There are some scattered reports of superconductivity above 162 K. For instance, R. G. Kulkarui has reported superconducting oxides having an approximate composition $CaO(0.5)ZnO(0.5)Fe(2)O(4)$, with critical temperatures in this range. Ogushi also reported superconductivity at room temperature in yet ill-defined niobium strontium lanthanum oxides. These reports have yet to be confirmed independently by other researchers.

In the prior art concerning superconducting wires, which is mostly based on the A15 class of intermetallic compounds of niobium with tin, germanium, or vanadium, ultrafine filaments of the superconducting materials are encased in a copper matrix. The process of manufacturing these multifilament wires is difficult and expensive since most intermetallic compounds are quite brittle, and thus are not easily reduced to small diameter wires by any of the prior art extrusion processes.

Bulk superconducting ceramic compositions are normally prepared by weighing out specific quantities of selected oxides. The combination is thoroughly mixed by conventional means and then fired at temperatures sufficiently high to induce solid state reaction and sintering of the desired ceramic composition and structure. In many of the copper based compositions, further annealing in pure oxygen is shown to improve the superconducting properties by enhancing the trivalent state of copper, believed to be essential to the high temperature superconducting phenomenon.

The above method for producing superconducting compositions is limited in the physical form of the superconductor so-produced and cannot be easily used to manufacture mechanically and electrically acceptable wires. Other methods such as the electron-beam evaporation method or the vapor phase epitaxial growth method can only produce thin films. Even the method which employs laser-melting of a ceramic bar to form single crystal whiskers, while yielding material with high current density capabilities, cannot be used to manufacture a continuous wire. The slurry process involving the oxides precursors followed by appropriate calcination and oxidation could possible be used for wire manufacturing, but the critical current densities achieved are still too low to be acceptable.

The new superconducting ceramics are brittle, and efforts to increase their strength and flexibility in bulk form have not been successful heretofore. Many workers in the prior art have tried to produce a "wire" directly from the superconducting ceramic itself, or by the oxidation of a precursor alloy. These result in wires that are mechanically weak with low current carrying capability. Once these superconductors have become known, it has been obvious to those skilled in the arts that if one desired to optimize the current carrying properties of the new ceramic superconductors, certain parameters needed to be controlled. For example, an anisotropy of critical current has been observed, and the indications are that maximum current density is conducted in a plane perpendicular to the "C" axis of the crystal structure in certain of the compounds. Another factor is that the coherence length of the charge carriers in these high temperature superconductors appears to be very small, of the order of 20 to 50 angstroms (a few lattice parameters).

Most workers agree that minute impurities do not have a major impact on transition temperature and critical current of these superconductors, providing that such impurities are well dissolved within the matrix. On the other hand, agglomeration at grain boundaries and the formation of important nonsuperconducting barriers at grain boundaries probably has a serious and deleterious effect on overall current carrying capabilities. This is particularly important if the extent of the "impure" grain boundaries exceeds the coherent length.

I have determined that the prior art multi-filament approach to produce superconducting wires from the new ceramic superconductors has a number of intrinsic shortcomings. I have therefore developed a completely new approach to the manufacturing of long and continuous superconducting wires of the new ceramic high temperature superconductors.

For instance, a large mass of copper is usually required in which to embed transitional superconducting filaments so as to support the current carrying capacity required in the event of accidental quench of the superconductors. This approach is required since traditional superconductors operate at only few degrees under their critical temperature. Thus, very small perturbations and temperature excursions can cause the small temperature rise necessary to quench the superconducting state. Furthermore, the large mass of copper also has the function of providing mechanical support for the superconducting filaments.

With the advent of high temperature superconductors, I have found that the combination of higher heat capacity (100 times larger than traditional superconductors) and higher allowed temperature excursions (up to 10 times larger), negates the need to provide for a copper matrix for quench protection. I have also found that, in some applications, this large mass of copper is actually detrimental when alternating currents and other electrical perturbations prevail.

I have found that a much better solution to producing a wire having superconducting properties is to form a composite wire consisting of up to four concentric layers, namely a supporting core, an interlayer (metallization), an active (superconducting) layer and an outer metallization. This form is much more flexible than any known in the prior art and is easier to produce as well.

OBJECTS OF THE INVENTION

Therefore, it is an object of this invention to provide methods of forming superconducting wires having markedly improved physical and electrical properties over those of the prior art.

Another object is to provide improved superconductive wires.

Still another object is to provide a wire having a supporting core combined with a superconducting layer and an outer metallized layer.

One other object is to provide a wire whose superconducting layer is composed of columnar grains with their "c"-axes perpendicular to the wire's axis.

Another object is to provide methods whereby the grain structure of the so-deposited superconducting layer is composed of grains with a relatively homogeneous size distribution.

Still another object is to provide a method whereby the so-deposited superconducting layer is amorphous.

A final object is to provide a wire with superconducting properties that is much more flexible, and that will carry supercurrents at much higher densities than is feasible by other techniques.

SUMMARY OF THE INVENTION

A composite wire having improved flexibility and current-carrying capacity is formed from a composite consisting of: 1) a metallic, or non-metallic, core wire, 2) an interlayer consisting of either: a) metals that melt lower than the to-be deposited superconducting ceramic layer, b) metals that melt at temperatures close to the melting point of said superconducting layer, and c) metals that melt higher than said superconducting layer, 3) a superconducting layer that has been directionally solidified from the molten superconductor 4) an overlayer as a thin film of a selected metal. The interlayer in some embodiments is preferably caused to oxidize to form an integral oxide layer on itself so as to promote better adhesion of the superconducting film. In yet some other embodiments, the interlayer is not required at all, and the superconducting layer is in direct contact with the core. An essential part of the instant invention is the process by which we obtain a high density superconducting layer with preferred crystallites orientation, consisting of moving the core (with or without an interlayer) through a melt of the superconducting oxide, so as to deposit on said core the superconducting oxide in the molten form, upon which the existing melt rapidly and directionally solidifies. The product of the instant invention has superior combination of mechanical and current carrying capabilities.

This invention relates to composite superconducting wires and to methods for forming said wires. The instant invention also relates to improved combinations wherein a refractory core is passed through a melt of the high critical temperature superconductor (with critical temperature above 23 K.), so as to be coated with the rapidly solidifying substance.

The rapid cooling and the fixed morphology of the moving thermal profile between the solid and liquid superconductor during the process assure that the microstructure of the superconducting layer is the same throughout the wire and consists of micrograins symmetrically oriented relative to the core, and having their "c" axis perpendicular to the core.

Obviously the formation of a superconducting wire capable of carrying very large electrical currents has great merit. Many prior workers have pursued this goal without solution heretofore. I have solved this problem by the practice of my new invention which incorporates a directionally solidified superconducting layer in a composite wire. In the practice of said invention, I have determined that it is best to produce a composite wire consisting of up to four concentric layers, namely a supporting core, an interlayer obtained by metallization, an active (superconducting) layer and an outer metallization.

More specifically, a superconducting wire according to the invention can comprise:

a refractory core having a melting point above a melt temperature of a superconducting ceramic having a critical temperature $T_c$ above 23 K.; and a layer of the superconducting ceramic coated onto the core by pulling the core through a melt of the superconducting ceramic.

In another aspect of the invention, the composite superconducting wire comprises:

a refractory core having a melting point above a melt temperature of a superconducting ceramic having a critical temperature $T_c$ above 23 K.; and a layer of the superconducting ceramic on the core directionally solidified in a direction perpendicular to the core so that the layer is made up of columnar crystallites extending radially of the core.

According to a feature of the invention, the wire can comprise an interlayer interposed between the core and the layer of superconducting ceramic, and an outer protective layer on the layer of superconducting ceramic.

The core can have a diameter of substantially 1 to 10 mils and can be selected from the group which consists of:

high-tensile-strength filaments selected from the group which consists of boron, alumina, silica and silicon carbide filaments;

platinum-group metal wires;

refractory metals protected from oxidation selected from the group which consists of molybdenum coated with molybdenum disilicide and tungsten coated with a glass; and refractory metals selected from the group which consists of tantalum, niobium, titanium and zirconium and alloys thereof.

The inter layer can be composed of a substance selected from the group which consists of:

a malleable metal with a melting point less than that of the superconducting ceramic;

a malleable metal with a melting point generally equal to that of the superconducting ceramic; and a refractory metal having a melting point above that of the superconducting ceramic, the interlayer having a thickness equal to at least 1 microinch and less than 0.5 mil.

Advantageously, the interlayer can be composed of:

aluminum and zinc as a malleable metal with a melting point less than that of the superconducting ceramic;

gold, silver, copper and alloys thereof as a malleable metal with a melting point generally equal to that of the superconducting ceramic; and platinum group metals, titanium, zirconium and hafnium and alloys thereof as a refractory metal having a melting point above that of the superconducting ceramic.

The superconducting layer can have a thickness between ¼ of the diameter of the core and three times the core diameter.

The invention also includes a method of forming the radially directionally solidified crystallites which involve the melting of a layer of the superconductive ceramic by exposing it to a radially symmetrical energy capable of effecting the melting. Advantageously, this is achieved by passing the core carrying the layer through the focus of a reflector which is preferably paraboloid of revolution and onto which a collimated beam of the energy, for example, a laser beam, is directed. More specifically, the method can comprise the steps of:

a refractory core having a melting point above a melt temperature of a superconducting ceramic having a critical temperature $T_c$ above 23 K.; and a layer of the superconducting ceramic on the core of the method comprising the steps of:

(a) coating a layer of a superconductive oxide adapted to form the ceramic onto the refractory core;

(b) melting a zone of the layer uniformly all around the core by drawing the core with the layer thereon through a focus of a paraboloid of revolution reflector, while directing onto the reflector a collimated beam of an energy of an intensity sufficient to melt the layer; and (c) cooling the melted layer with a substantially radially symmetrical thermal gradient in the region of the cooling melt deposited on the core so that the layer of superconducting ceramic is formed with radially directed growth of columnar grains of the superconducting ceramic.

Advantageously, the core and layer are drawn through a hole in the apex of the reflector.

BRIEF DESCRIPTION OF THE DRAWING

The above and other objects, features and advantages of my invention will become more readily apparent from the following description, reference being made to the accompanying highly diagrammatic drawing in which.

SPECIFIC DESCRIPTION

Figure 1A:
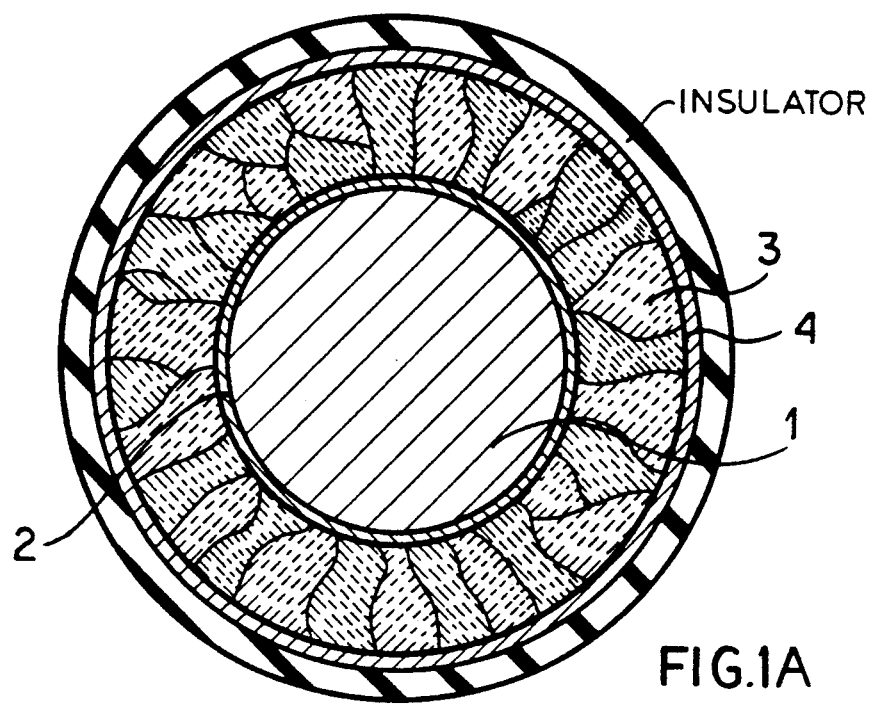
FIG. 1A is a cross sectional view, drawing to an enlarged scale diagrammatically illustrating a composite wire fabricated by a process in which the apparatus of the invention is used.

In FIG. 1A, I have shown a cross section of the composite wire, perpendicular to the longitudinal axis of the wire. The core 1 provides most of the mechanical support to the composite wire both in use and during manufacture. The interlayer 2 is formed by slight oxidation of the core (in case of a metallic core) or by the deposition of an appropriate metal using methods already known in the prior art.

The interlayer can be an optional layer and is not always needed in the embodiment of this invention. I have further determined that the active superconductive layer 3 on the interlayer needs to be deposited as a solidified layer, having a microstructure consisting of columnar grains with their "c"-axis perpendicular to the wire axis, i.e. extending generally radially. The superconducting substance must be protected from the environment with an external normal metal layer 4 rather than a dielectric (insulating) layer. It should be understood that, in specific applications, a number of these superconducting composite wires can be assembled in parallel to provide a cable, and that said cable can (and should) be insulated with an appropriate dielectric as in the prior art. In should also be understood that, in some applications, a single composite wire is used. In this case, the outer metallization layer is covered as in the prior art. In the practice of this invention, it is not desired that an insulating layer be placed directly in contact with the outer surface of the superconductor.

Figure 1B:
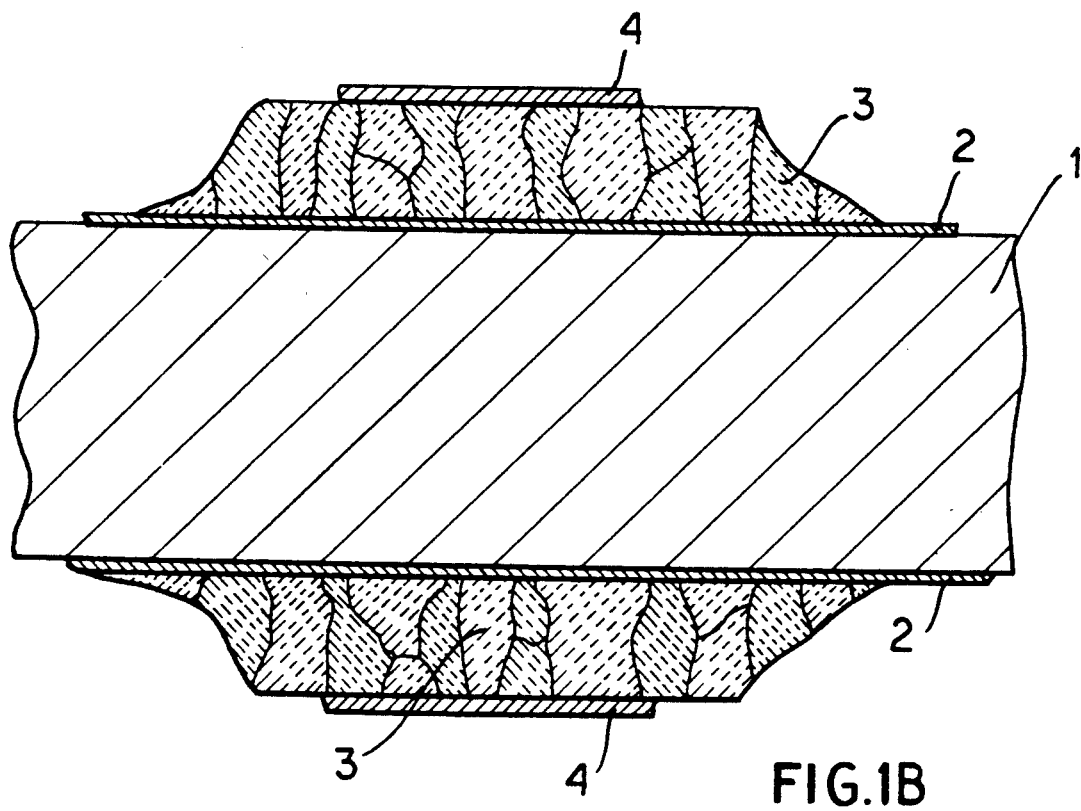
FIG. 1B is a longitudinal cross section of the wire.

In FIG. 1B, I have shown a drawing of the cross section of my new and improved superconducting composite wire along its longitudinal axis.

In the practice of my new and improved invention, I have not described methods for the deposition of the external metallization since these are available in the prior art, and will be apparent to those skilled in the arts. I will be further obvious that such metallization steps can be incorporated on a continuous basis within the process of this invention, without detracting from the novelty and usefulness of the instant invention. I have found that this final metallization can be carried out as a separate process on the finished composite wire, or can be included as a finishing step during the production of the composite wire.

I have found that it is essential to achieve as close to 100% of theoretical density within the said active layer as may be possible, and to produce a microstructure similar to that reported for texture melted $Y_{1.0}Ba_{1.8}Cu_{3.0}O_{6.3}$ compositions. I have further determined that it is an essential part of the instant invention to obtain crystallites within the rapidly solidified superconductor layer that are oriented with their "$c_o$"-axes perpendicular to the current-flow direction. I have also found that compositional uniformity must be maintained and grain boundary compositional variations need to be minimized so that my new and improved superconducting composite wire can operate most efficiently.

I have also found that the grain structure of the rapidly solidified superconducting layer must be composed of grains with a relatively homogeneous size distribution. It is by this means that I can obtain a marked improvement in the mechanical properties of the ceramic film layer. However, it is also important that the ceramic layer be thin enough to allow some bending without fracture, thus producing a product that is flexible and easily handled in the field.

In the practice of my invention, I have discovered that only certain techniques can be employed to achieve the objects of the instant invention, as exemplified by my new and improved superconducting wire. The specific process involves coating the "core", with any of the new ceramic high temperature superconducting compositions by forcing the core to pass through a small pool of the liquefied ceramic just a few degrees above the melting point of the superconducting substance, thus drawing on it, or dragging with it, a thin layer of the solidified superconductor composition.

It should be understood that the specific material being coated upon the core wire is not superconducting at this point, but becomes so only when cooled down to a temperature below the superconductor's critical temperature. The geometry of the apparatus by which the coating process is accomplished, has a circular symmetry around the core, and the cooling thermal profile is such that directional solidification, mostly from the core/superconductor interface, occurs in an outward direction. By this process, I obtain a composite wire of the instant invention wherein the superconducting compound is caused to form a thin film of said compound under closely controlled conditions with the desired properties of grain orientation and narrow grain size distribution.

In the technique of the instant invention, a refractory core is pulled rapidly through a molten mass of the superconducting material so as to rapidly solidify on the core said superconductor. Although there are many ways to draw a wire through a molten mass and retain on the wire a layer of the solidified liquid, I have determined that a large number of parameters need be controlled simultaneously to successfully carry on the continuous production of the composite wire of the instant invention.

These parameters include: providing the same thermal history along the finished wire including a fixed thermal profile, avoiding excessive contamination of the melt from the containment vessel, and maintaining radial symmetry around the core. An apparatus to implement the methods of the instant invention which possesses the required symmetry, flexibility and said parameters and can thus be implemented as a continuous process is shown herein.

Figure 2:
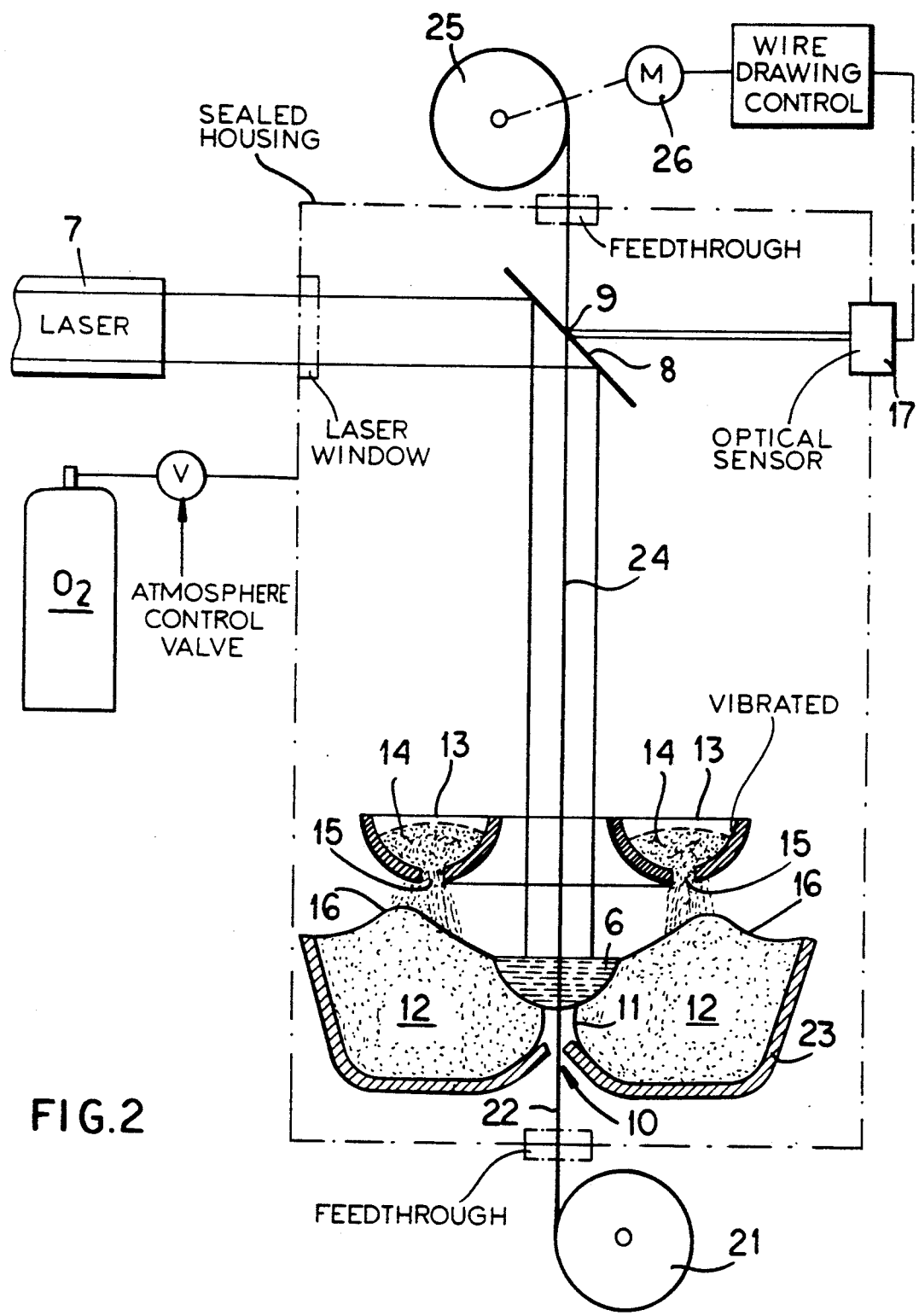
FIG. 2 is a diagram of the apparatus used in the fabrication of the wire.

The general manufacturing setup is shown in FIG. 2. The apparatus of FIG. 2 comprises a spool 21 on which an appropriate refractory core is wound. The untreated wire 22 is passed through a perforation 10 in the bottom of a circular treating crucible 23. The treated wire with a superconducting layer 24 is then spooled on a receiving spool 25. The receiving spool is controlled by a variable speed motor 26.

The deposition of the superconducting layer is achieved in a small pool 6 of liquefied superconductor (which of course is not superconducting at the melting point). This small pool, which is kept at a temperature very close to the melting point of the superconductor, is heated from the top by a laser light source 7. This light source supplies just enough heat to keep the small pool liquid. The light source needs to be collimated and can be a laser beam diffused optically to cover an area of about 1 cm in diameter at the surface of the superconducting pool 6. I have also found that the pool can be larger or smaller than 1 cm in diameter, and that the process can be used to deposit the superconducting substance simultaneously on a multiplicity of cores.

In FIG. 2 the light source is located at 90 degrees relative to the direction of the moving wire, and is directed upon the superconducting pool by a mirror 8, which is at 45 degrees to the beam. The mirror 8 has a small aperture 9 at its center allowing for the free passage of the coated wire 24 through it. As will be seen below, this aperture has a secondary control function.

The process is started with the light source off. The crucible 23 is loosely filled with prereacted superconducting powder at the desired composition and stoichiometry. The perforation 10 at the bottom of the crucible must be kept cold with an appropriate water cooling device. As the untreated core 22 moves up, it forms a small channel 11 through the superconducting powder 12. Once the pool 6 is created and a steady state is established in the system, this channel will partially sinter and solidify, thereby avoiding excessive loss of material through the bottom perforation. The liquid in the pool is prevented from flowing down by surface tension forces and by the upward forces applied on the molten liquid by the moving refractory core (good wetting of the core is obtained by means explained below). An alternative method in the practice of my invention involves first forming a perforated bushing from the superconducting material and placing it above the bottom perforation.

As the liquid superconductor is withdrawn and deposited as a thin film on the refractory core, additional powder is supplied to the crucible on a continuous basis from a container 13 suspended above the crucible. The container 13 is filled with the raw materials 14 and can be refilled intermittently or continuously without interrupting the wire drawing process.

The container is supported by a structure which is mechanically independent of the support structure of the crucible (not shown in FIG. 2), and is caused to vibrate continuously. The container has the form of a half toroid (or other topologically equivalent circular shape), and has perforations 15 at its bottom and above the inner slope of a circular crater 16 formed in the crucible. It is important that the feed does not impinge directly the surface of the liquid, but reaches the pool's rim by rolling on the side of the crater, around the pool of superconducting materials formed during the steady state operation of the system.

The perforation at 9 in the deflecting mirror 8 has a dual role. The first function is to allow free passage of the processed wire and keep the processed wire from absorbing light which can slow down the cooling of the molten superconductor. The second function is to monitor the cross section of the finished wire. That part of the beam that is not reflected toward the molten pool, is partially obstructed by the wire, and thus the optical sensor 17 is used as a control output for the process. In other less refractory superconductors (particularly the bismuth oxide containing superconductors), I find it necessary to block the center of the light beam at the source, since too much energy is absorbed by the processed wire, causing uneven thermal treatment on the different sides of the wire, with resultant buckling of the finished wire. This optical blocking is not shown in FIG. 2 since in most cases it is not used. When the blocking is exercised, the thickness of the processed wire is monitored separately by a very low power laser and sensor, located perpendicular to the motion of the wire, but operating in the same mode as the sensor 17.

One could of course conceive of other designs such as one that is heated by other methods through the crucible and which draws the composite wire from a crucible completely filled with the liquid superconductor. However, I have demonstrated that the preferred embodiment described herein better resolves problems associated with contamination of the melt from the containing crucible.

I have found that most of the high temperature superconducting ceramics are quite reactive in their molten state and cannot be contained easily in any of the prior art refractory materials. These molten oxides readily react over time with metals of the platinum group with the possible exception of rhodium and osmium that were not tried. Even the refractory oxides like zirconia, alumina and silica react with these superconducting materials. It should be readily apparent that my new and improved design allows for contamination-free containment of the molten superconducting oxides for indefinite periods. This arises from the unique design used to contain the melt phase, whereby the superconducting mass that is at an elevated temperature is in contact only with the superconducting material itself (and the oxidizing atmosphere). At the container wall, a much lower temperature is maintained so as to avoid any contaminating reactions, and furthermore, the superconducting material at the container's wall never becomes part of the solidifying superconducting wire.

In the embodiments of the invention presented here, the choice of the refractory core can be quite broad, and can depend on the final intended utility of the superconducting wire, and to some extent on its reaction rate with the molten superconductor oxide. I have determined that boron filaments, silicon carbide, alumina, quartz, steels, particularly some stainless steels, and nichrome can be employed as the core material.

All of these materials have melting points in excess of the melting point of the new ceramic superconductors (900° to 1200° C.). One can also use wire made from one of the above materials which has a modified surface. The modification includes partial oxidation, or possibly an appropriate metallization. I have also established that formation of a thin oxide layer on such metallized, or metallic cores, causes marked improvement in the wetting of the wire by the molten superconductive oxide and promotes nucleation at the surface. I have also found a malleable metallization to be useful when there is a significant difference of thermal expansion coefficients between the core and the superconducting oxide. This will be discussed in greater detail below.

Another group of core materials which can be used are the refractory metals whose oxides are not stable (like molybdenum and tungsten with volatile oxides) or niobium, tantalum, zirconium and titanium whose oxides rarely form diffusion barriers. I have determined that if these oxides are used, they should be appropriately protected during the short dwell time in the melt. I have found that useful protecting films include for molybdenum, molybdenum disilicide, and for certain other metals, a silica rich low-viscosity glass. In the case where silicon or quartz is present, I have found that the thickness of the interaction layer between the superconductor and the silicon-bearing substrate is minimal relative to the superconducting layer and of little significance in most applications.

A necessary part of my invention includes limiting the initial heating of the core wire. The wire must arrive at the molten pool at a temperature well below the pool temperature. This is another reason for maintaining the size of the pool at a minimum, thus avoiding excessive preheating of the core.

When the core is made to penetrate the pool at a relatively low temperature, nucleation on the core begins at once at the wire liquid interface. I have determined that the configuration of my new invention is conducive to growing crystallites on the wire with the $c_0$ axis perpendicular to the wire, which as mentioned above, is the intended direction so necessary for the practice of my invention. The probable reason for the success of the growth orientation is rooted in the fact that the preferred growth direction in perovskites is in the $c_0$ direction, and the large thermal gradient imposed by the cold core assures this to be the growth direction.

I have also found that the main control parameters of the process in the instant invention are the energy input, the rate of movement of the core through the liquid, the wall temperature of the crucible (which has a specific effect as to the size of the pool and rate of thermal losses from the pool), and the profile of energy density from the impinging laser beam. A preferred energy distribution in the beam includes a minimum at the center of the beam with an annulus of high energy density and a declining energy density toward the outer perimeter of the beam. Such a distribution in the profile of the laser energy beam assures good melting of all particles reaching the center of the pool where deposition on the wire is caused to occur, without raising the temperature of the central location in the pool too high. The blocking of the central portion of the beam alluded to above, when depositing less refractory superconductors is a good technique to achieve the desired energy distribution.

In a slightly different embodiment of this invention, the mirror 8 can be eliminated and utilization of an off-axis illumination of the pool can be practiced. This method is employed with the less refractory superconductors which tend to be more volatile and after some operating period, can cause an accumulation of deposits on the mirror used for "on axis" illumination. In the off axis illumination method, some degree of asymmetry is introduced, creating a slanted solidification front on the wire (unlike the circular front in the on-axis illumination method). However, due to the fixed thermal profile, the final results are indiscernible from the on-axis illumination method.

I have also shown that an annealing step, following the drawing step, may be required to stabilize the desired superconductive phase. This annealing step will vary with the type of superconductor employed (more so with the $Y_{1.0}Ba_{1.8}Cu_{3.0}O_{6.3}$ ceramic than with the bismuth and bismuth-lead containing ceramics). If such is the case, an optional annealing tubular furnace is positioned on line between the mirror 8 and the finished wire spool 25.

I have found that a large portion of the superconducting layer grows while the wire is still in the pool, and as a result, these crystallites are larger and well oriented with their $c_o$ axis almost perpendicular to the core. Additional crystallites are formed in the layer when the wire emerges from the pool, entraining some liquid on its surface. This additional entrained liquid solidifies mostly as a continuation of the growth of the original crystallites. In some cases, nucleation occurs at the surface, causing the appearance of a second thin layer of crystallites on the outer surface.

It should also be clear that a degree of flexibility in process parameters can be imparted by the incorporation of an interlayer between the core and the superconductor. The appropriate choice of such an interlayer drastically enhances the columnar nature and the orientation of the superconductor's solidified crystallites.

In order to further clarify my new and improved invention, a further discussion of each of the components of the composite wire is hereforth presented. The general structure of the composite wire includes a core, an optional interlayer, the superconducting layer and an outer metallization. I have determined that the following is essential in the practice of my invention.

CORE FIBER

The judicious choice of a core material is quite important. The core is to provide mechanical support to the wire at current-carrying temperatures. Furthermore, it must be refractory enough to withstand the melt temperatures for the short dwell time in the melt. Because the dwell time at the melting point of the ceramic is very short, the interaction between the core and the superconducting ceramic melt is minimal, making the use of cores that may react with the deposited ceramic layer over long periods of time feasible.

INTERLAYER

I have found that a number of problems, which could arise in the practice of my invention, are solved by the introduction of an interlayer between the superconducting layer and the core. The problems which may otherwise arise are:

Superconductor crystallite nucleation and growth with C axis parallel to the core's axis may occur.

Excessive chemical interaction between the molten superconductor and the core may occur.

There may be mismatch of thermal expansion between the core and the superconducting layer.

There may be need to establish an oxygen partial-pressure gradient on the superconducting layer during solidification and during the required reoxidation step.

The actual choice of an interlayer will therefore depend on the type of application and the above-stated problems. The thickness of such interlayer should be controlled and be no more than 0.5 mil. in thickness.

The materials to be used for such an interlayer can be divided into three main groups: 1) low melting point (below the liquidus of the ceramic) metals possessing refractory oxides; 2) metals with melting points around the superconductor's liquidus; and 3) refractory metals possessing high melting point oxides.

In the first group, I have found that the use of a low melting point metal like aluminum (melting point 660° C.) or zinc (melting point 420° C.), allows for the contraction of the superconducting oxide on the molten film during the deposition process on the core. At the same time, the metallic film does undergo a certain degree of oxidation. It is clear, however, that most of the metal film interlayer does survive in spite of the very rapid heating, and any formation of an oxide layer actually becomes relatively impervious to further oxygen migration.

In the second group, I have found that the use of silver (melting point 960° C.) is especially useful since it has been reported as an enhancer of superconducting critical current and does not oxidize as readily as aluminum and zinc. In the same group, I include gold (M.P. 1063° C.) and copper (M.P. 1083° C.). I have determined that the latter does compete for oxygen with the active ceramic, but the reaction time is so short that this effect is not easily perceptible. The low cost of copper and ease of deposition on the core make it particularly useful.

For the third group, I have shown that zirconium and titanium (with respective melting points of 1850° C. and 1660° C. well above the liquidus of the superconducting ceramic) are particularly useful for certain cases in the practice of the instant invention. Both of these possess refractory oxides.

SPECIFIC EXAMPLES

1. The apparatus of FIG. 2 is set up. The selected feed core is loaded on the feed-reel, and threaded through the bottom of the crucible and the hole in the mirror to the pickup spool. The ambient atmosphere, usually pure oxygen, is bled in at a constant feed rate. The light source is activated and adjusted to provide the correct size molten pool. This is done with the wire moving at a slow speed to assure the formation of an appropriate channel in the bottom of the crucible. After a short time, a steady state is established and the feed apparatus is allowed to feed the crucible in a continuous manner. The speed of the wire is increased until the desired superconducting layer thickness is achieved. That part of the core used prior to establishing the steady state is discarded.

Once the superconducting film has been deposited, the spooled wire is overcoated with a metallized coating such as copper, using techniques already known in the art. The product of the instant invention incorporates the superconducting properties of the thin film composition plus the strength and flexibility of the core wire and metallic overlayer.

2. The apparatus and methods of Example 1 are followed, except that, if the 123 compound or another superconducting oxide requiring post processing oxidation is used, a tubular annealing furnace is introduced between the pool and the mirror, with set temperature usually no higher than half that of the melting point of the oxide (this tubular oven is open since the ambient atmosphere contains sufficient oxygen).

3. The apparatus and methods of Example 1 are followed, except that a metallization is first applied to the core prior to the superconducting layer deposition process. For example, a quartz core is used on which a copper metallization is applied by conventional means. This metallized core is now used in the apparatus of the present invention to produce the composite wire of the instant invention.

DETAILED EXAMPLE

The apparatus of FIG. 2 is set up using as a "vessel" a cylinder 3" in diameter and 2" long of hot pressed 1,2,3 material. The cylinder is shaped with diamond tools (a 1" coring machine and a diamond saw) to have a seat 1" in diameter and 1" long. A 1 mm hole is drilled in the middle of the "vessel".

The cylinder from which the vessel is made is prepared in the following manner: a mixture of 112.9 grams of $Y_2O_3$, 394.68 grams of $BaCO_3$ and 268.62 grams of CuO is mixed in a mortar with a pestle until well mixed (about five minutes). An Inconel die with a loose Inconel bottom of about 3 inch in inner diameter is filled with the mixture and an Inconel plunger is fit inside the die to cover the powder. The covered die is then positioned in a tubular furnace preheated to 925° C. on a support and pressure of about 7500 psi is applied to the plunger. After about 15 minutes, the die is removed from the furnace and the pellet of mixed oxides forced out by pressing on one of the two plungers. The pellet is allowed to cool to room temperature. The cylinder itself is not superconducting, nor, apparently, are the powders well reacted to form a completely homogeneous mixed oxide. The pellet is however quite dense (about 5% percent porosity), and is easily handled without excessive friability.

The cylinder is positioned on a water-cooled coil of copper tubing, and a core of boron 4 mils in diameter, precoated with silver is passed through the hole and rolled on the pickup reel. An atmosphere of oxygen is maintained in the chamber and is continuously replenished.

A $CO_2$ laser capable of delivering 1000 watts is used near full power to initiate the formation of the pool and then the power is reduced to less than 100 watts. After a short time of vibratory feeding of the pool and pulling the core through, a pool of the typical cross section shown in FIG. 2 is formed. A steady state of superconductor deposition of about 4 mils in thickness can be reached at pulling rates of about 1 to 5 cm/sec.

For a thinner layer of only one mil, higher pulling speeds of about 20 to 50 cm/sec are used and the laser power further reduced. The tension in the pulled wire is of the order of 50 grams, and amply sufficient to keep the wire from vibrating excessively.

Figure 3:
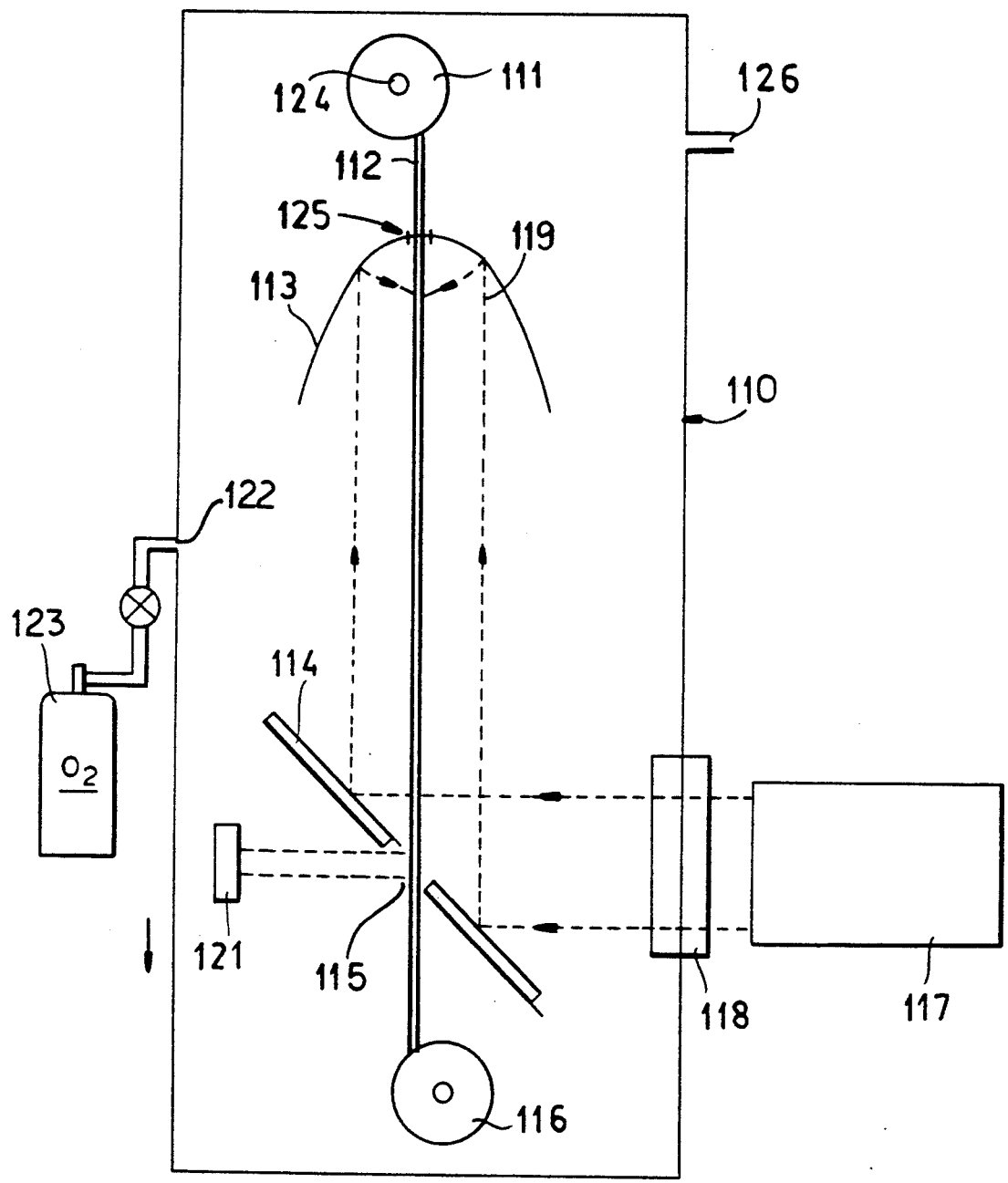
FIG. 3 is a diagram showing an apparatus for the flash melting in a radially symmetrical manner of the ceramic layer upon the core.
Figure 4:
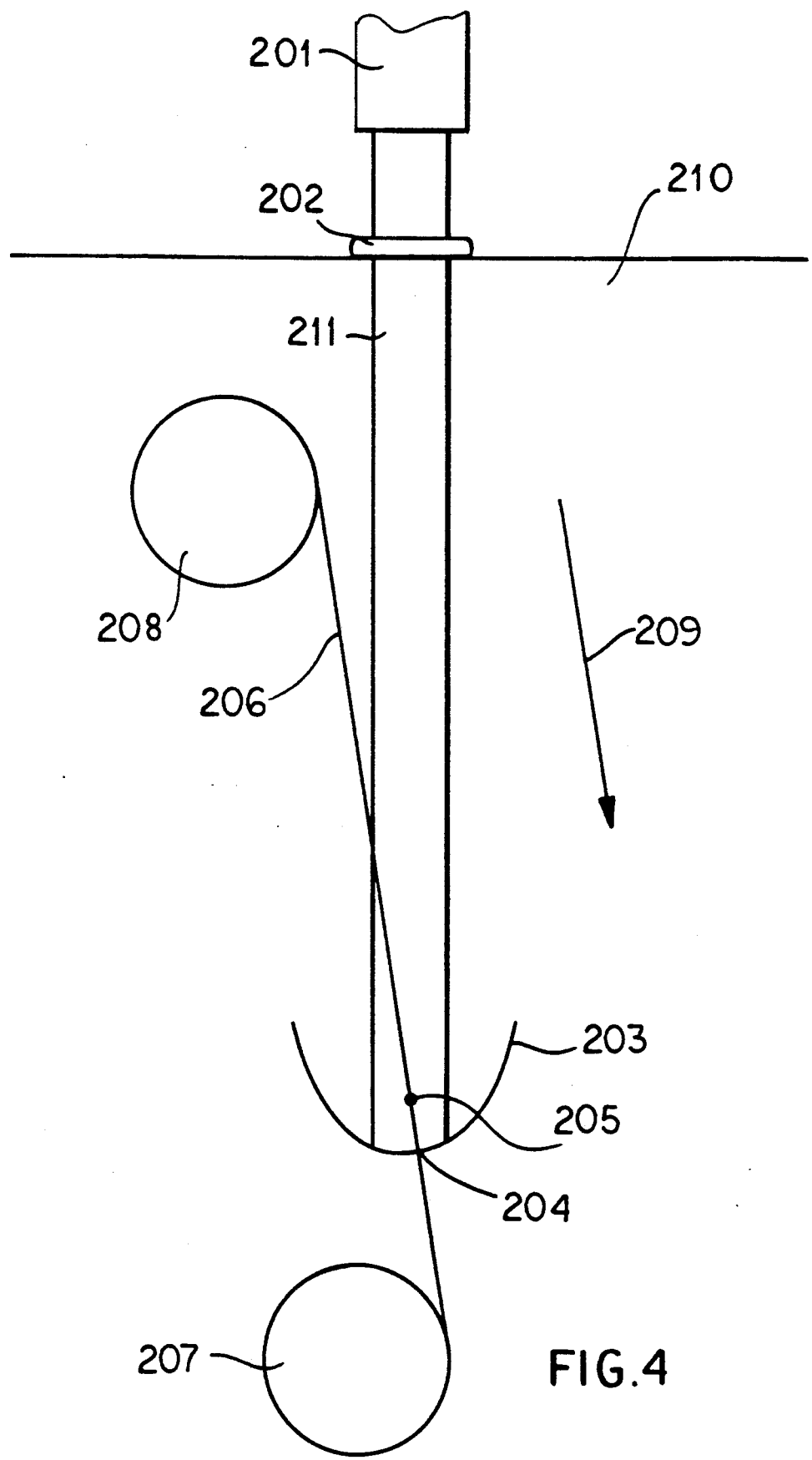
FIG. 4 is a diagram showing a modification of this flash melting arrangement.

FIGS. 3 and 4 show arrangements for the flash melting of a layer and the directional cooling of the melted zones in a radial direction so as to achieve the radial growth of the crystallites as described. The core used in these figures can be previously coated with the superconductor by any conventional technique or by drawing the core through the melt as has been described in connection with FIG. 2.

FIG. 3 shows the configuration of the system when purely radial symmetry is desired. In a process enclosure 10 a spool 111 is positioned on a friction axis 124. From the spool 111 the untreated composite wire 112 previously coated with the superconductor composition, is allowed to pass through a perforation 125 of a paraboloid of revolution shaped mirror 113 and through a perforation 115 of a flat mirror 114 which is at 45' to the composite wire, and then can be rewound on a motorized spool 116.

A laser light source 117 emits an essentially parallel beam which traverses an optically transparent window 118 and then impinges on the mirror so that it illuminates the parabolic mirror 113. Essentially, all the energy of the beam is concentrated at the focus 119 of the paraboloid of revolution mirror creating there an annulus of molten superconductor. The molten zone is moved out of focus and cools via conduction to the cold core and mostly through radiation to the cold walls of the enclosure 110. Some convection cooling due to the presence of oxygen in the enclosure occurs as well. The system is best operated with the wire's direction in the direction of the gravitational vector.

The operation of the device involves reaching an optimal steady state rate of movement of the untreated core through the focus of the parabolic mirror. The speed is adjusted by slowly increasing the speed of the motor powering the drawing spool 116 until a fixed meniscus is formed at the focal point of the parabolic mirror (residual porosity in the untreated oxide and surface tension in the liquefied portion cause the meniscus to be concave). When the speed is too slow, periodic thickening and thinning of the treated wire are observed. When the speed is very slow, detachment of droplets is easily observed. When the speed is too fast, one observes very little change between the diameter of the treated wire and untreated wire and occasional spalling of the outer layer can be observed near drawing end (cold) of the wire.

A more automated control of the drawing speed can be achieved by positioning a photodetector 121 in the path of the residual beam passing around the treated wire through the hole 115 in the flat mirror 114.

The atmosphere within the enclosure can be dynamically controlled by feeding an appropriate gas or gas mixture from a source 123 through an opening 122 and pumping at a controllable rate the gas at another opening 126. It should be clear that the system can operate under partial or high vacuum as well. When treating the 123 superconductor composition in this manner, I find that the introduction of delta singlet oxygen in the system will result in a high concentration of trivalent copper in the finished wire.

FIG. 4 shows another laser flash melting system in which the laser light source 201, collimated to produce a parallel beam, directs that beam through a transparent window in the enclosure 210 which can be evacuated or provided with a protective gas to prevent contamination of the superconductor oxide.

Best results are obtained when the chamber contains delta singlet oxygen as mentioned previously. The beam 211 is directed onto a circular paraboloid of revolution mirror 203 whose focal point 205 is traversed by a wire 206 delivered by a spool 207 and passing through a pinhole 204 in this mirror. The wire consists of the refractory core coated with the superconductor ceramic. The superconducting wire is wound up on a spool 208. The vector 209 represents the action of gravity. It will be apparent that the laser light is focused on a small circular spot or zone of the untreated wire causing flash melting of the superconducting layer which is followed by cooling by the radial abstraction of heat using, for example, radiation to cooled walls of the chamber (not shown).

The slight off-axial geometry of the illumination may cause some degree of asymmetry which appears to be insignificant and may even promote the formation of columnar growth because of the introduction of a stress field. In any event, the radial columnar growth previously described occurs with this system as well.

I claim:

1. A method of making a composite high-temperature superconducting wire, comprising:

a refractory core having a melting point above a melt temperature of a superconducting oxide having a critical temperature $T_c$ above 23 K.; and a layer of said superconducting oxide on said core, said method comprising the steps of:

(a) coating a layer of a ceramic oxide for forming said superconducting oxide onto said refractory core;

(b) melting a zone of said ceramic oxide layer uniformly all around said core by drawing said core with said ceramic oxide layer thereon through the focus of a mirror having the shape of a paraboloid of revolution, while directing onto said mirror a collimated beam of an energy with an intensity sufficient to melt said ceramic oxide layer; and (c) cooling the melted layer with a substantially radially symmetrical thermal gradient in the region of the cooling melt deposited on said core so that said layer of said superconducting oxide is formed with radially directed growth of columnar grains of said superconducting oxide with their c-axis perpendicular to the wire's axis.

2. The method defined in claim 1, further comprising the steps of:

coating said core with an interlayer prior to coating said core with said layer of said superconducting oxide; and coating said layer of said superconducting oxide with a protective layer.

3. The method defined in claim 1 wherein said core coated with said ceramic oxide layer is drawn through a hole in said mirror.

4. The method defined in claim 3 wherein said core coated with said ceramic oxide layer is further drawn through a perforation of a flat mirror which is at a direction at 45° to the wire.

* * * * *